(12) United States Patent
Inoue (10) Patent No.: US 7,932,125 B2
(45) Date of Patent: Apr. 26, 2011

(54) SELF-ALIGNED CHARGE STORAGE REGION FORMATION FOR SEMICONDUCTOR DEVICE

(75) Inventor: Fumihiko Inoue, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 294 days.

(21) Appl. No.: 12/183,756

(22) Filed: Jul. 31, 2008

(65) Prior Publication Data
US 2009/0032864 A1 Feb. 5, 2009

(30) Foreign Application Priority Data

Jul. 30, 2007 (JP) .................. 2007-197868

(51) Int. Cl.
*H01L 21/00* (2006.01)

(52) U.S. Cl. .......... 438/90; 438/216; 438/261; 438/591; 438/593; 257/E21.002; 257/E21.18; 257/E21.21; 257/E21.423; 257/E21.679

(58) Field of Classification Search .................... 438/90, 438/216, 261, 591, 593; 257/E21.002, E21.18, 257/E21.21, E21.423, E21.679
See application file for complete search history.

(56) References Cited

U.S. PATENT DOCUMENTS

| | | | | |
|---|---|---|---|---|
| 6,538,292 | B2* | 3/2003 | Chang et al. | 257/391 |
| 7,394,702 | B2* | 7/2008 | Ding et al. | 365/185.29 |
| 2008/0128789 | A1* | 6/2008 | Park et al. | 257/324 |
| 2009/0206387 | A1* | 8/2009 | Kang et al. | 257/324 |

* cited by examiner

*Primary Examiner* — Long K Tran (57) ABSTRACT

Devices and methods for forming self-aligned charge storage regions are disclosed. In one embodiment, a method for manufacturing a semiconductor device comprises forming a layer of a nitride film stacked between two oxide films on a semiconductor substrate, and forming a gate electrode on the layer of the nitride film stacked between the two oxide films. In addition, the method comprises removing side portions of the nitride film such that a central portion of the nitride film below a center portion of the gate electrode remains, oxidizing the central portion of the nitride film, and forming charge storage layers in the side portions of the nitride film, where the charge storage layers are separated by the central portion of the nitride film.

13 Claims, 8 Drawing Sheets

SELF-ALIGNED CHARGE STORAGE REGION FORMATION FOR SEMICONDUCTOR DEVICE

CLAIM OF PRIORITY

This application claims priority from Japanese patent application 2007-197868 filed on Jul. 30, 2007.

FIELD OF TECHNOLOGY

The present invention relates to semiconductor devices and methods, particularly to data storage layers of semiconductor memory devices.

BACKGROUND

In a flash memory device, a memory cell has a floating gate or an insulating film called a charge storage layer, and data is stored by charging electrons in the charge storage layer. A silicon oxide nitride oxide silicon (SONOS) type structure of the flash memory device stores electrons in the nitride film in an oxide-nitride-oxide (ONO) film. For some time, a reduction of the size of the flash memory device has been a pressing issue. To scale down the memory cell, channel spacing between a source region and a drain region of the memory cell needs to be reduced. However, if the channel spacing is made small, spacing between charge storage regions which locally store electrons in the charge storage layer on both ends of the gate electrode of the memory cell also becomes small. Thereby, a phenomenon called a complementary bit disturb (CBD) occurs, where the charges stored in the charge storage regions interfere with each other. For example, charge or bit isolation between the two bits stored in two adjacent charge storage regions becomes increasingly difficult as the channel length is decreased. This may result in the bits from the two charge storage regions contaminating each other.

Figure 1A:
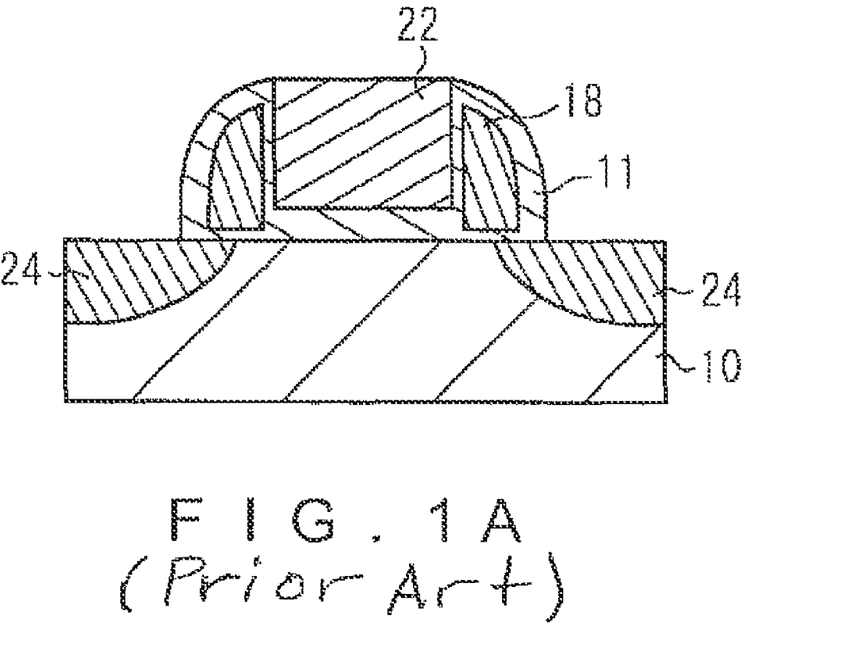
FIG. 1A and FIG. 1B are cross-sectional views of a conventional flash memory.
Figure 1B:
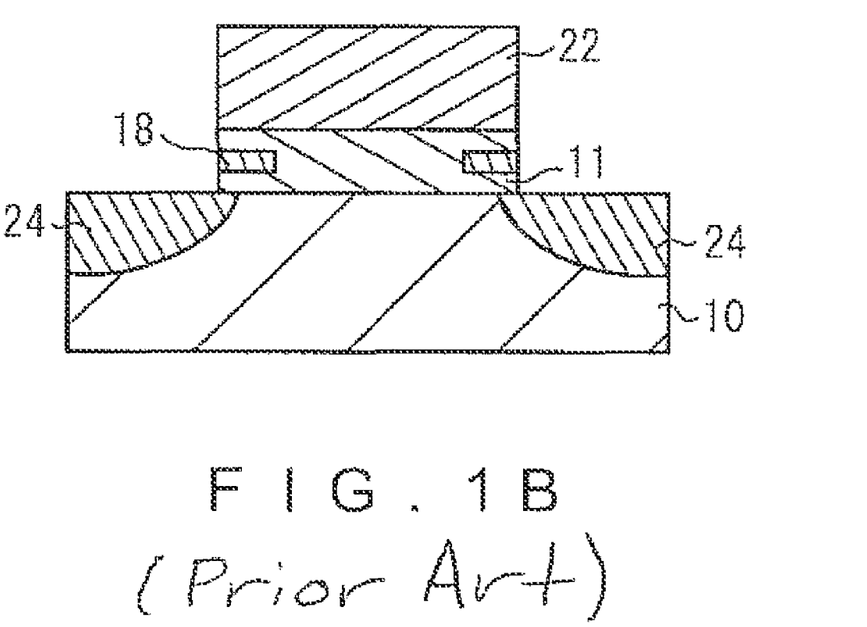

As for a NAND-type flash memory device, a method or a structure for suppressing the interference in the charge storage regions due to the CBD is proposed as in FIG. 1A and FIG. 1B. In FIG. 1A, a gate electrode 22 is formed on an oxide film 11 which is deposited above a semiconductor substrate 10. On both sides of the gate electrode 22, two charge storage layers 18 are separately formed within the oxide film 11. In the semiconductor substrate 10, diffusion regions 24, where each region serves as either a source region or a drain region, are formed. However, since the charge storage layers 18 are formed extended from the sides of the gate electrode 22, the structure may hinder the effort of scaling down the memory cell.

In FIG. 1B, on the semiconductor substrate 10, the oxide film 11 is formed between the gate electrode 22 and the semiconductor substrate 10. The two charge storage layers 18 are formed in the oxide film 11 separate from each other, with each charge storage layer 18 formed at each edge of the gate electrode 22. The diffusion regions 24 are formed in the semiconductor substrate 10. The structure described in FIG. 1B is effective in suppressing the effect of the CBD without sacrificing the real estate of the memory cell. However, aligning the gate electrode 22 and the charge storage layers 18 may be difficult since the separated charge storage layers 18 are formed before the gate electrode 22 is formed.

SUMMARY

This summary is formed to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a method for manufacturing a semiconductor device which comprises forming a layer of a nitride film stacked between two oxide films on a semiconductor substrate, and forming a gate electrode on the layer of the nitride film stacked between the two oxide films. In addition, the method comprises removing side portions of the nitride film such that a central portion of the nitride film below a center portion of the gate electrode remains, oxidizing the central portion of the nitride film, and forming charge storage layers in the side portions of the nitride film, where the charge storage layers are separated by the central portion of the nitride film.

Another embodiment of the present invention is directed to a semiconductor device which comprises a nitride film stacked between central portions of two oxide films formed on a semiconductor substrate, a gate electrode on the layer of the nitride film stacked between the two oxide films, and two charge storage layers formed between the two oxide films separated by the nitride film.

As will be illustrated in the detailed description, other embodiments pertain to systems, methods, and devices for forming self-aligned charge storage layers in a semiconductor device. A method for forming the self-aligned charge storage layers includes depositing an ONO film and a gate electrode on a semiconductor substrate, and removing side portions of the nitride film from the ONO film. The method further includes oxidizing the remaining nitride film, and then depositing a silicon nitride film to fill the removed side portions of the nitride film. By doing so, the charge storage layers are separated by the oxidized nitride film and self-aligned with the gate electrode without involving a complex fabrication process.

BRIEF DESCRIPTION OF THE DRAWINGS

Example embodiments are illustrated by way of example and not limitation in the figures of the accompanying drawings, in which like references indicate similar elements and in which:

FIG. 2A to FIG. 3C are cross-sectional views showing an exemplary method for manufacturing a flash memory, according to one embodiment.

FIG. 6A through FIG. 7C are cross-sectional views illustrating an exemplary method for manufacturing a flash memory, according to one embodiment.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to systems, methods, and devices for forming self-aligned charge storage layers in a semiconductor device. A method for forming the self-aligned charge storage layers includes depositing an ONO film and a gate electrode on a semiconductor substrate, and removing side portions of the nitride film from the ONO film. The method further includes oxidizing the remaining nitride film, and then depositing a silicon nitride film to fill the removed side portions of the nitride film. By doing so, the charge storage layers are separated by the oxidized nitride film and self-aligned with the gate electrode without involving a complex fabrication process.

Figure 2A:
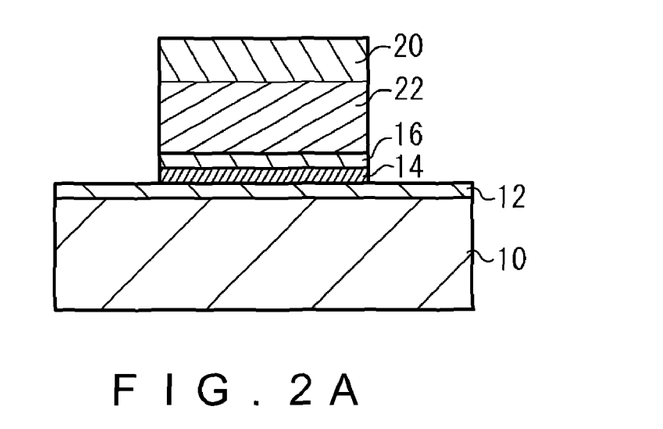

FIG. 2A to FIG. 3C are cross-sectional views showing an exemplary method for manufacturing a flash memory, according to one embodiment. In FIG. 2A, a tunnel oxide film 12 (e.g., 10 nm thick SiO2 film) is formed on a semiconductor substrate 10 (e.g., a p-type Si substrate or a p-type region). A nitride film 14 (e.g., 7 nm thick SiN film) is formed on the tunnel oxide film 12. A top oxide film 16 (e.g., 10 nm thick SiO2 film) is formed on the nitride film 14. It is appreciated that the tunnel oxide film 12 and the top oxide film 16 are formed by using a chemical vapor deposition (CVD) method or a thermal oxidation method, and the nitride film 14 is formed by using the CVD method. A polysilicon film (e.g., 100 nm thick) is formed on the top oxide film 16. A mask layer 20 (e.g., a 30 nm thick SiN film), which masks a gate electrode 22 to be formed in the polysilicon film, is formed on the polysilicon film. By using the mask layer 20, the polysilicon film, the top oxide film 16, and the nitride film 14 are etched by using a reaction ion etching (RIE) method. As a result, the polysilicon film becomes the gate electrode 22 (e.g., 60 nm wide).

Figure 2B:
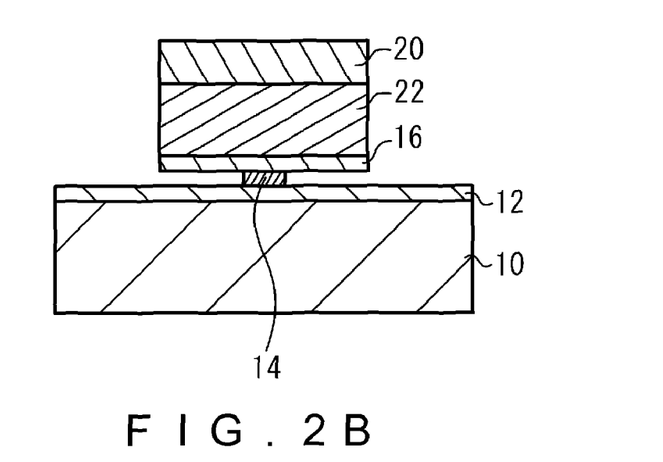

In FIG. 2B, the nitride film 14 is immersed in an etchant (e.g., a phosphoric acid of 140° C. to 155° C.) to remove the nitride film 14 (e.g., approximately 23 nm from side surfaces of the gate electrode 22 towards the center thereof). Thereby, the nitride film 14 (e.g., 14 nm wide) remains below a center portion of the gate electrode 22. When the nitride film 14 is immersed into the etchant, the tunnel oxide film 12 and the top oxide film 16 are also immersed in the etchant. However, since a selection ratio of the SiN films with respect to the SiO2 film is equal to or more than 100, the tunnel oxide film 12 and the top oxide film 16 are hardly etched.

Figure 2C:
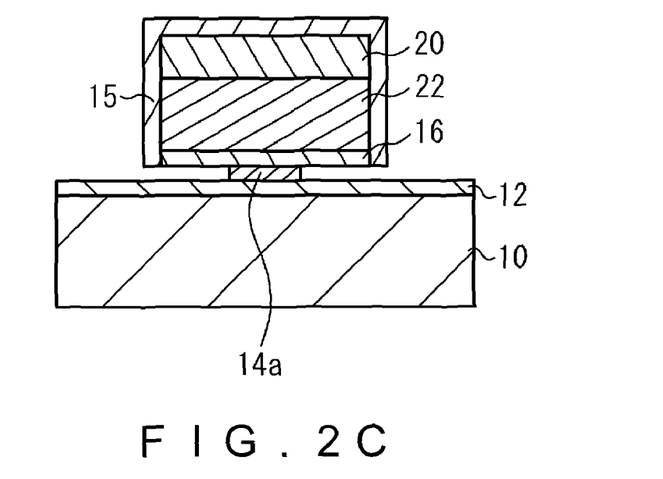

In FIG. 2C, the nitride film 14 which remains below the center portion of the gate electrode 22 is plasma oxidized in a mixed gas having a flow ratio of Ar:O2:H2=200:2:1, under the condition of a substrate temperature of 400° C. and a gas pressure of 2 Torr. Thereby, the remaining nitride film 14 is fully oxidized, and becomes an oxide film 14a (e.g., 21 nm wide). Also, by such plasma oxidation, an oxide film 15 is formed on the side faces of the gate electrode 22 and on side surfaces and an upper surface of the mask layer 20. It is appreciated that other oxidation methods, such as radical oxidation, can be used in place of the plasma oxidation. By making the oxidation condition of the radical oxidation in a substrate temperature of 700° C. and a gas pressure of 0.4 Torr in the mixed gas having a flow ratio of O2:H2=10:1, the remaining nitride film 14 can be made into the oxide film 14a having a width of 21 nm, as illustrated in FIG. 2C.

Figure 3A:
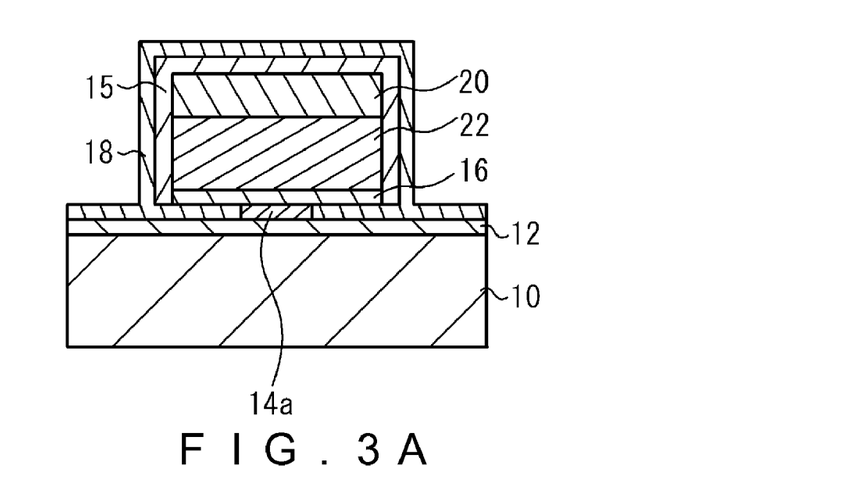

In FIG. 3A, a charge storage layer 18 (e.g., a SiN film) is formed on the semiconductor substrate 10 to cover the gate electrode 22 and the mask layer 20 using a low pressure chemical vapor deposition (LP-CVD) method. It is appreciated that the LP-CVD method is performed using a mixed gas having a flow ratio of SiH2Cl2:NH3=1:10 under a condition of a substrate temperature of 700° C. and a gas pressure of 0.3 Torr. Since the LP-CVD method is excellent in infiltration deposition, a region between the tunnel oxide film 12 and the top oxide film 16, where the nitride film 14 is removed, is filled with the charge storage layer 18. It is appreciated that other methods, such as an atomic layer deposition (ALD) method, may be used instead of the LP-CVD method.

Figure 3B:
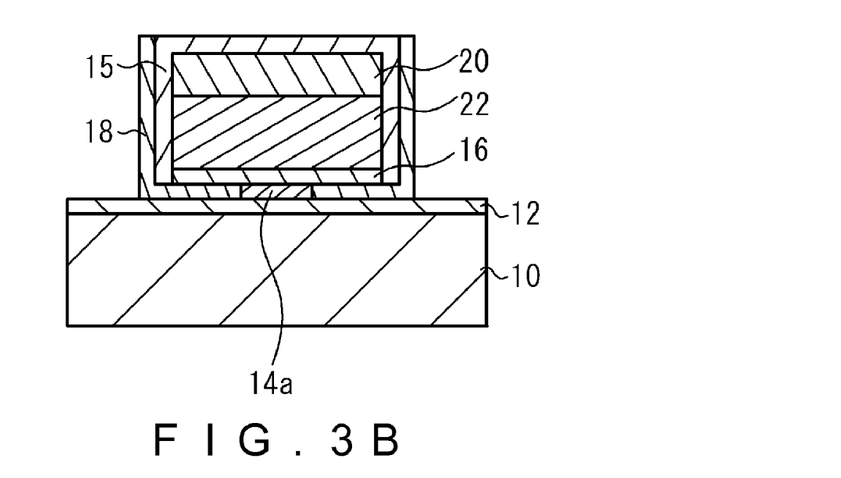

In FIG. 3B, for example, the charge storage layer 18 formed on the mask layer 20 and the charge storage layer 18 formed on the semiconductor substrate 10 in the periphery of the gate electrode 22 are etched (e.g., using the RIE method). Accordingly, the charge storage layers 18 remain along the regions where the nitride film 14 is removed and along the side faces of the gate electrode 22 and the mask layer 20.

Figure 3C:
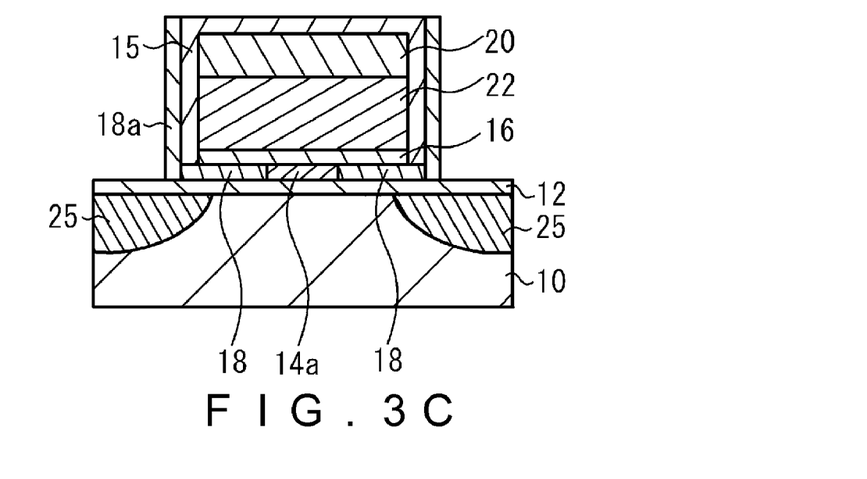

In FIG. 3C, the plasma oxidized charge storage layers 18 formed on the side surfaces of the gate electrode 22. Thereby, the charge storage layers 18 on the side surfaces of the gate electrode 22 become oxide films 18a. Accordingly, the charge storage layers 18 remain only in the regions where the nitride film 14 is removed. By using the gate electrode 22 as a mask, N-type diffusion regions 25 serving as a source region and/or a drain region are formed by implanting arsenic ions in the semiconductor substrate 10.

Figure 4:
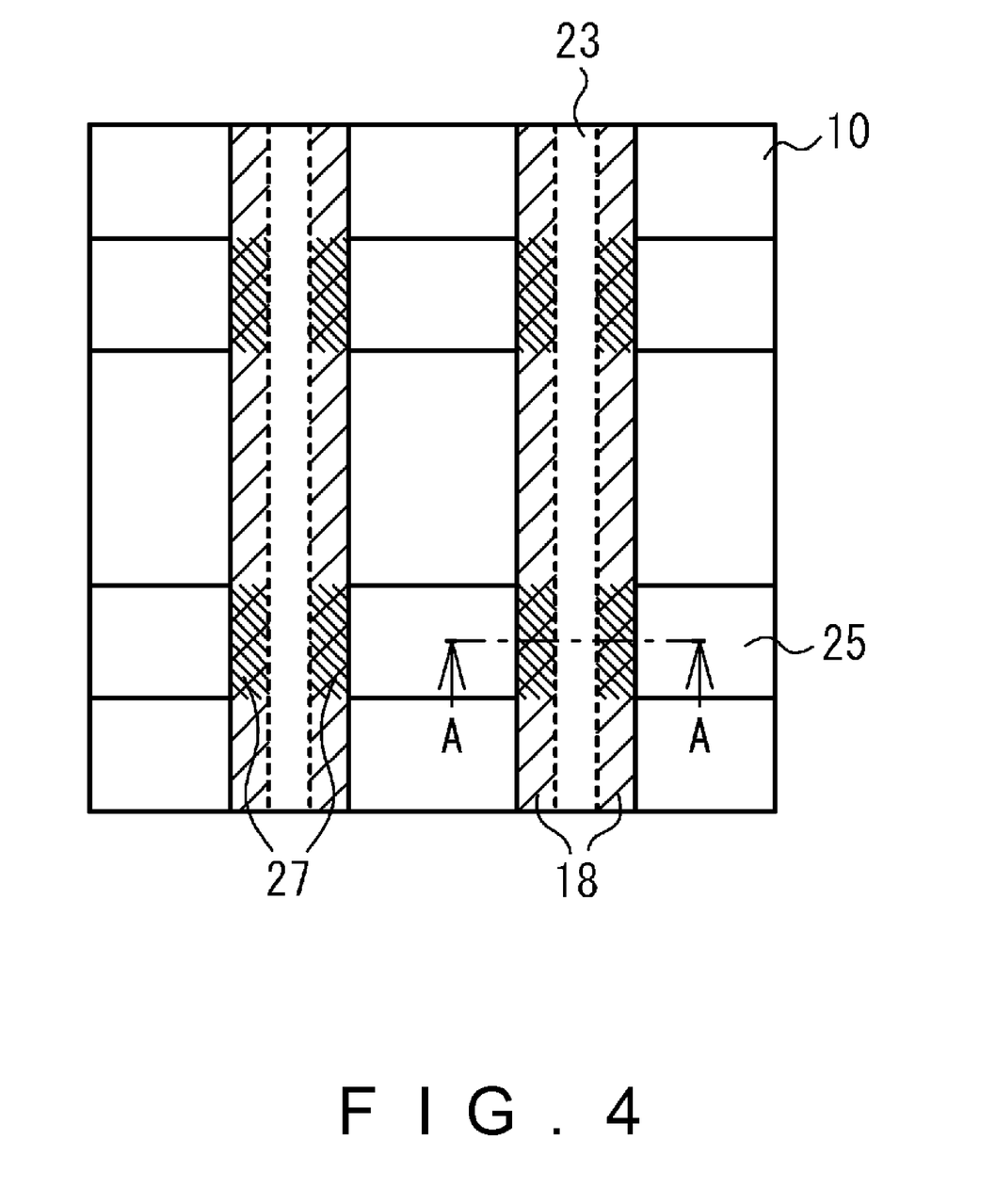
FIG. 4 shows a top view of the flash memory of FIG. 2A through FIG. 3C, according to one embodiment.

FIG. 4 shows a top view of the flash memory of FIG. 2A through FIG. 3C, according to one embodiment. In the figure, the tunnel oxide film 12 and the like are omitted to simplify the drawing. In FIG. 4, the N-type diffusion regions 25 as bit lines that serve as a source region and/or a drain region are formed in the semiconductor substrate 10. A word line 23 serving as the gate electrode 22 is formed and crosses the N-type diffusion regions 25. On both sides along the word line 23, the charge storage layers 18 are formed between the word line 23 and the semiconductor substrate 10. FIG. 4 shows the charge storage layers 18 through the word line 23. The portions of the charge storage layers 18 where the word line 23 and the N-type diffusion region 25 intersect become charge storage regions 27 which store charges. By using the N-type diffusion regions 25 on both sides of the word line 23 in place of the source region and/or the drain region, it is possible to store charges into each charge storage region 27 on both sides of the word line 23. The schematic cross-sectional views shown in FIG. 2A through FIG. 3C are schematic cross-sectional views of a part corresponding to line A-A in FIG. 4.

According to one embodiment, as shown in FIG. 2A, the tunnel oxide film 12, the nitride film 14, the top oxide film 16, the gate electrode 22, and the mask layer 20 are formed sequentially on the semiconductor substrate 10. Next, as shown in FIG. 2B, the side portions of the nitride film 14 are removed, so it remains below the center portion of the gate electrode 22. Then, as shown in FIG. 2C, the remaining nitride film 14 is oxidized and the nitride film 14 is made into the oxide film 14a. Then, as shown in FIG. 3C, the charge storage layers 18 are formed in the regions where the nitride film 14 is removed. According to such manufacturing process, it is possible to form the charge storage layers 18 separated by the oxide film 14a on both ends of the gate electrode 22, where the charge storage layers 18 are self-aligned with respect to the gate electrode 22. Therefore, it is unnecessary to perform alignment of the gate electrode 22 and the charge storage layers 18.

Further, as shown in FIG. 2B, the process of removing the nitride film 14 adopts wet etching by using a phosphoric acid. Since the wet etching by using the phosphoric acid or the like is isotropic etching, it is possible to progress the etching from both ends of the nitride film 14 towards the center thereof. Accordingly, the nitride film 14 can easily remain at the center portion of the nitride film 14, that is, below the center portion of the gate electrode 22. Thereby, as for the method for removing the nitride film 14, it is preferable to use isotropic etching.

In the wet etching by the phosphoric acid, by controlling the temperature of the phosphoric acid, the etching rate can be controlled. Accordingly, the etching amount of the nitride film 14, that is, the amount of the nitride film 14 to remain below the center portion of the gate electrode 22 can be controlled accurately.

Further, the process of oxidizing the nitride film 14 adopts plasma oxidation or radical oxidation as shown in FIG. 2C. Since plasma oxidation and radical oxidation have extremely high oxidizing power against nitride films, the nitride film 14 can be selectively oxidized with a low temperature and a high oxidation rate. Thereby, compared with a case of oxidizing with a high temperature for a long period of time by thermal oxidation or the like, the damage to the tunnel oxide film 12 or the like can be suppressed. Accordingly, the reliability degradation of the semiconductor device can be suppressed. Further, since the nitride film 14 can be oxidized selectively, the film thickness of the tunnel oxide film 12 and the top oxide film 16 can be determined by the film thickness deposited by the CVD method or the like, as shown in FIG. 2A. Thereby, the film thickness of the tunnel oxide film 12 and the top oxide film 16 can be controlled accurately. Accordingly, as the method for oxidizing the nitride film 14, it is preferable to use plasma oxidation or radical oxidation.

Further, as shown in FIG. 3A, the charge storage layer 18 is formed on the semiconductor substrate 10 to cover the gate electrode 22 and the mask layer 20. Further, as shown in FIG. 3B, the charge storage layer 18 formed on the mask layer 20 and on the semiconductor substrate 10 in the periphery of the gate electrode 22 is removed, and the charge storage layer 18 formed along the region where the nitride film 14 is removed and along the side faces of the gate electrodes 22 remains. Further, as shown in FIG. 3C, the charge storage layers 18 formed on the side faces of the gate electrode 22 are oxidized and made into the oxide films 18a. According to such manufacturing process, the charge storage layers 18 can be easily formed in the regions where the nitride film 14 is removed.

Further, as shown in FIG. 3C, among the charge storage layers 18 remaining along the regions where the nitride film 14 is removed and along the side faces of the gate electrode 22, the charge storage layers 18 formed along the side faces of the gate electrode 22 are oxidized and made into the oxide films 18a. Thereby, the charge storage layers 18 remaining in the regions where the nitride film 14 is removed can be covered with the oxide films. Accordingly, the charge storage layers 18 can be protected from being damaged in the subsequent process.

Figure 5:
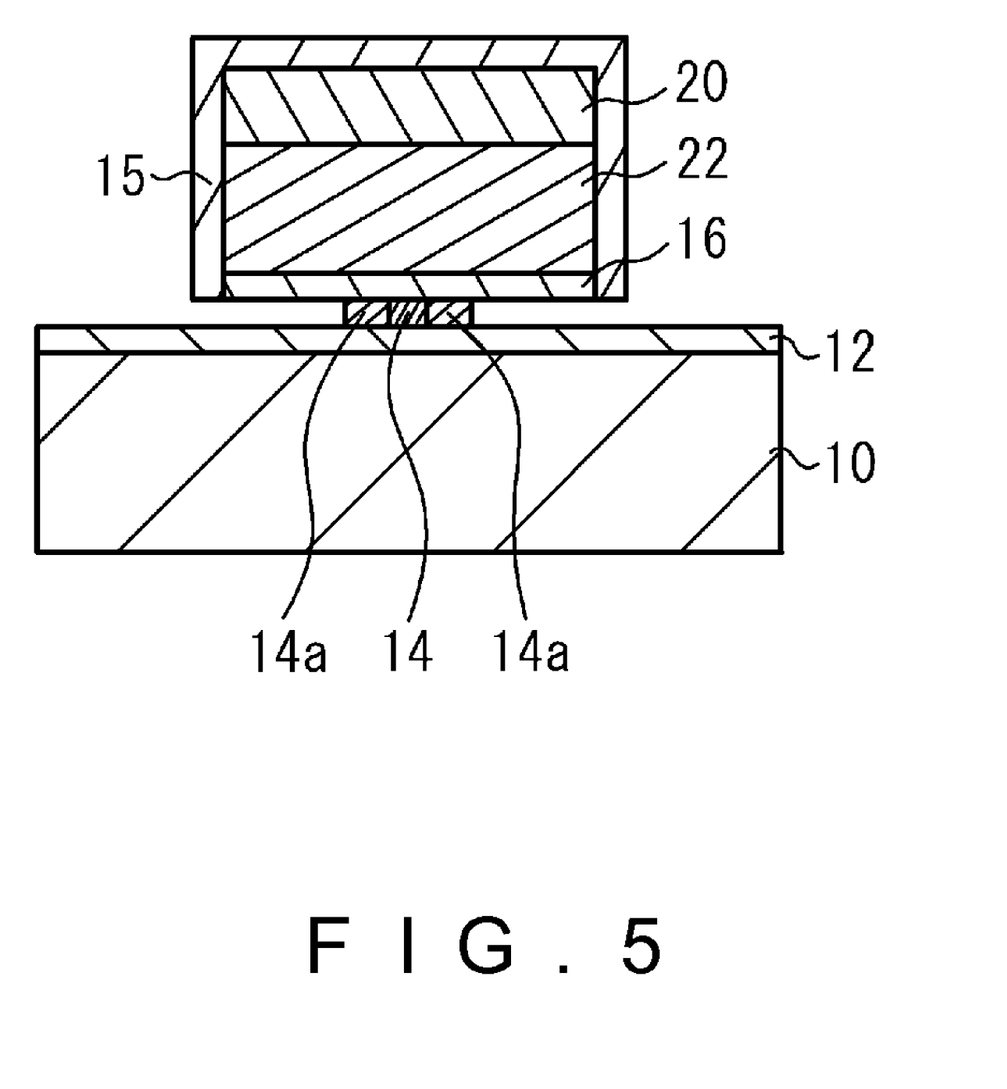
FIG. 5 is a cross-sectional view illustrating an exemplary flash memory, according to one embodiment.

Further, in the process of oxidizing the nitride film 14, as shown in FIG. 2C, a case of completely oxidizing the nitride film 14 make the nitride film 14 into the oxide film 14a is shown as an example. However, in another embodiment, only the outer edges of the nitride film 14 may be oxidized. As shown in FIG. 5, the center portion of the nitride film 14 remains as it is while oxidizing the end portions of the nitride film 14. Accordingly, the charge storage layers 18 formed under both ends of the gate electrode 22 can be separated, thus suppressing interference of the charges stored in the charge storage regions 27. It is appreciated that the time taken to oxidize the end portions of the nitride film 14 according to the method described in FIG. 5 is less than the method described in FIG. 2A through FIG. 3C. Accordingly, the tunnel oxide film 12 or other components may be lessened, and the reliability degradation of the semiconductor device can be further suppressed.

Furthermore, although the manufacturing methods described above employs the nitride film 14, other types of insulating film or floating gate can be, used instead. It is also appreciated that the fabrication methods described above can be used to manufacture a semiconductor device which includes but not limited to a NOR-type flash memory as well as a NAND type flash memory.

Figure 6A:
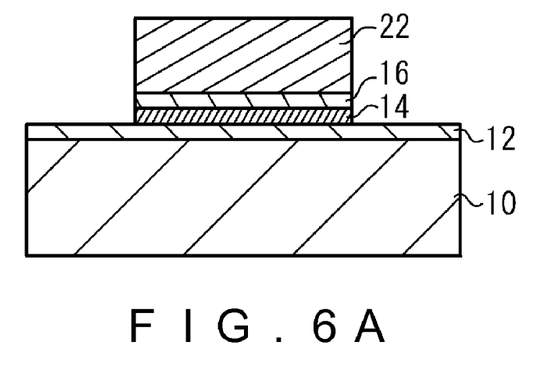

FIG. 6A through FIG. 7C are cross-sectional views illustrating an exemplary method for manufacturing a flash memory, according to one embodiment. In FIG. 6A, the tunnel oxide film 12, the nitride film 14, the top oxide film 16, and the polysilicon film are sequentially formed on the semiconductor substrate 10. On the polysilicon film, a photoresist (not shown) which is used as a mask for the gate electrode 22 is formed. By using the photoresist, the polysilicon film, the top oxide film 16, and the nitride film 14 are etched. Thereby, the polysilicon film becomes the gate electrode 22.

Figure 6B:
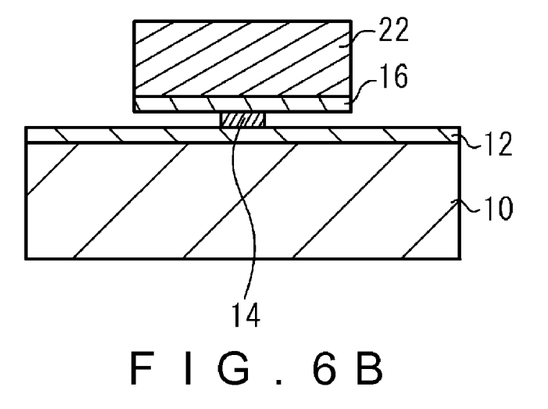
Figure 6C:
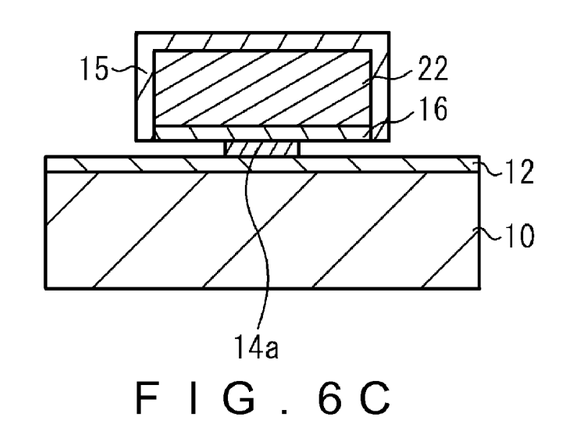
Figure 7A:
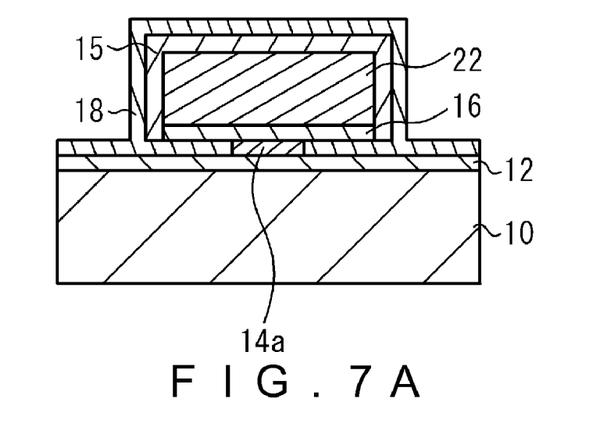
Figure 7B:
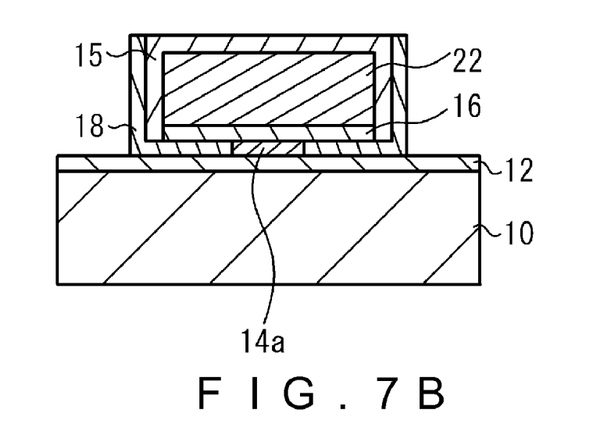

In FIG. 6B, the nitride film 14 is selectively removed such that the nitride film 14 remains below a center portion of the gate electrode 22. In FIG. 6C, the remaining nitride film 14 is plasma oxidized completely. Accordingly, the nitride film 14 becomes the oxide film 14a. Further, by such plasma oxidation, the oxide film 15 is formed on the side faces and the upper face of the gate electrode 22. In FIG. 7A, the charge storage layer 18 is formed on the semiconductor substrate 10 to cover the gate electrode 22. In FIG. 7B, the charge storage layer 18 formed on the gate electrode 22 and the charge storage layer 18 formed on the semiconductor substrate 10 in the periphery of the gate electrode 22 are removed.

Figure 7C:
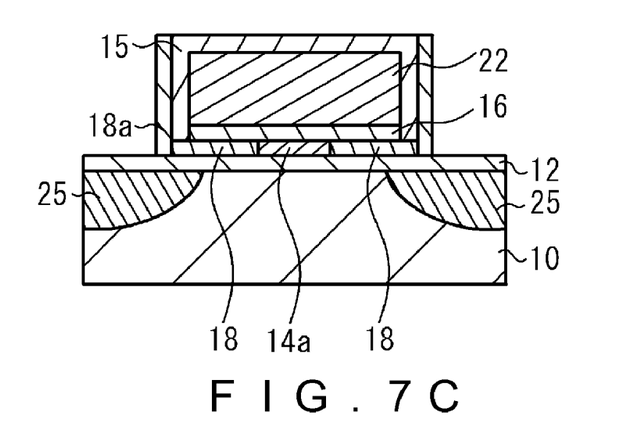

In FIG. 7C, the charge storage layers 18 formed on the side faces of the gate electrode 22 are plasma oxidized. Accordingly, the charge storage layers 18 on the side surfaces of the gate electrode 22 become the oxide films 18a. By using the gate electrode 22 as a mask, the N-type diffusion regions 25 serving as a source region and/or a drain region are formed in the semiconductor substrate 10. According to this embodiment, the gate electrode 22 may be manufactured without using a mask layer, thus further simplifying the manufacturing process of the charge storage layers 18.

Figure 8A:
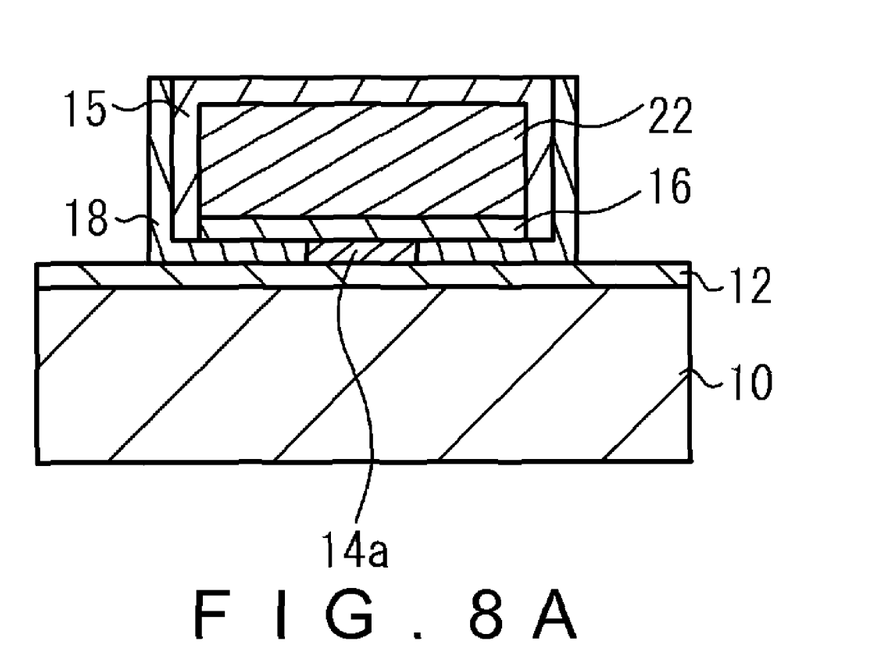
FIG. 8A and FIG. 8B are cross-sectional views illustrating an exemplary method for manufacturing a flash memory, according to one embodiment.
Figure 8B:
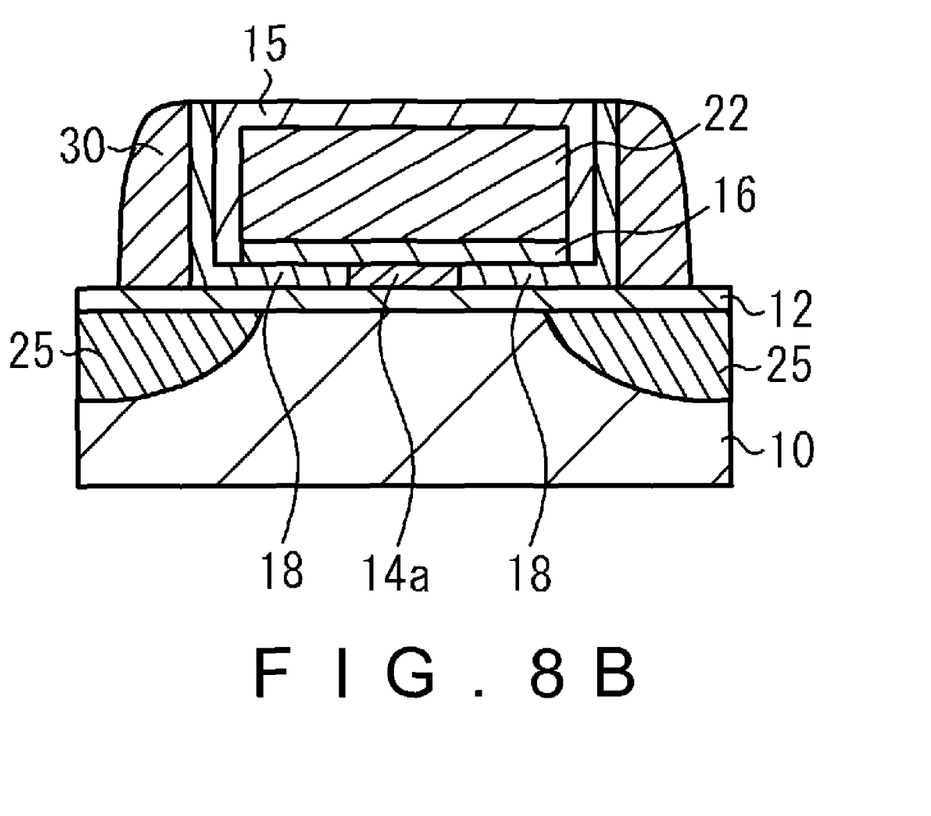

FIG. 8A and FIG. 8B are cross-sectional views illustrating an exemplary method for manufacturing a flash memory, according to one embodiment. Firstly, a flash memory shown in FIG. 8A is formed by performing the manufacturing process explained with reference to FIG. 6A through FIG. 7B. With reference to FIG. 8B, by using the gate electrode 22 as a mask, the N type diffusion regions 25 serving as a source region and/or a drain region are formed in the semiconductor substrate 10. For example, sidewall layers 30 made of a SiO2 film are formed to cover the charge storage layers 18 formed on the side faces of the gate electrode 22. The sidewall layers 30 are formed to protect the exposed charge storage layers 18 in the subsequent step.

In the fabrication process described in FIG. 8A and FIG. 8B, the charge storage layers 18 formed on the side surfaces of the gate electrode 22 are not oxidized. The charge storage layers 18 formed on both ends of the gate electrode 22 are separated from each other. Also, the charge storage layers 18 formed on the side surfaces of the gate electrode 22 are separated from the gate electrode 22 by the oxide film 15. Therefore, the charge storage layers 18 formed on the side faces of the gate electrode 22 can remain as they are without being oxidized, thus suppressing the interference of the charges stored in the charge storage regions.

The previous description of the disclosed embodiments is formed to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for manufacturing a semiconductor device, the method comprising:
    forming a layer of a nitride film stacked between two oxide films on a semiconductor substrate;
    forming a gate electrode on the layer of the nitride film stacked between the two oxide films;
    removing side portions of the nitride film such that a central portion of the nitride film below a center portion of the gate electrode remains;
    oxidizing the central portion of the nitride film; and
    forming charge storage layers in the side portions of the nitride film,
    wherein the charge storage layers are separated by the central portion of the nitride film.

2. The method of claim 1, wherein the two oxide films comprise:
    a tunnel oxide film formed on the semiconductor substrate; and
    a top oxide film formed on the nitride film.

3. The method of claim 2, wherein the forming the gate electrode comprises:
    forming a polysilicon layer on the layer of nitride film stacked between the two oxide films;
    forming a mask layer on the polysilicon layer; and
    etching the polysilicon layer, the top oxide film, and the nitride film using the mask layer to form the gate electrode.

4. The method of claim 2, wherein the forming the gate electrode comprises:
    forming a polysilicon layer on the layer of nitride film stacked between the two oxide films;
    forming a photoresist on the polysilicon layer; and
    etching the polysilicon layer, the top oxide film, and the nitride film using the photoresist to form the gate electrode.

5. The method of claim 1, wherein the oxidizing the central portion of the nitride film comprises oxidizing the central portion of the nitride film completely.

6. The method of claim 1, wherein the oxidizing the central portion of the nitride film comprises oxidizing end portions of the central portion of the nitride film.

7. The method of claim 1, wherein the removing side portions of the nitride film is performed by using an isotropic etching.

8. The method of claim 1, wherein the oxidizing the central portion of the nitride film is performed by using a plasma oxidation.

9. The method of claim 1, wherein the oxidizing the central portion of the nitride film is performed by using radical oxidation.

10. The method of claim 1, wherein the forming the charge storage layers comprises:
    forming the charge storage layers along the side portions of the nitride film and along side surfaces of the gate electrode; and
    oxidizing the charge storage layers formed along the side surfaces of the gate electrode.

11. The method of claim 1, wherein the forming the charge storage layers comprises:
    forming the charge storage layers along the side portions of the nitride film and along side surfaces of the gate electrode; and
    forming sidewall layers on side surfaces of the charge storage layers so as to cover the charge storage layers formed on the side surfaces of the gate electrode.

12. The method of claim 11, wherein side surfaces of the charge storage layers on the side surfaces of the gate electrode are not oxidized.

13. The method of claim 1, the method further comprising forming a source region and a drain region in the semiconductor substrate by using the gate electrode as a mask.

* * * * *